(12) United States Patent
Tang

(10) Patent No.: US 10,147,781 B2
(45) Date of Patent: Dec. 4, 2018

(54) DUAL-SIDED OLED DISPLAY AND PACKAGE METHOD THEREOF

(71) Applicant: Wuhan China Star Optoelectronics Technology Co., Ltd., Wuhan (CN)

(72) Inventor: Yuejun Tang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 15/318,981

(22) PCT Filed: Oct. 12, 2016

(86) PCT No.: PCT/CN2016/101912
§ 371 (c)(1),
(2) Date: Dec. 15, 2016

(87) PCT Pub. No.: WO2018/040235
PCT Pub. Date: Mar. 8, 2018

(65) Prior Publication Data
US 2018/0061923 A1    Mar. 1, 2018

(30) Foreign Application Priority Data
Aug. 30, 2016   (CN) .......................... 2016 1 0777214

(51) Int. Cl.
H01L 27/32    (2006.01)
H01L 51/52    (2006.01)
H01L 51/56    (2006.01)

(52) U.S. Cl.
CPC ........ H01L 27/3267 (2013.01); H01L 51/524 (2013.01); H01L 51/56 (2013.01)

(58) Field of Classification Search
None
See application file for complete search history.

(56) References Cited

U.S. PATENT DOCUMENTS

2009/0130941 A1* 5/2009 Boroson ............. H01L 51/5237
445/25
2016/0343791 A1   11/2016 Liu et al.

FOREIGN PATENT DOCUMENTS

| CN | 201540892 | 8/2010 |
| CN | 101908533 | 12/2010 |
| CN | 103078063 | 5/2013 |
| CN | 104576697 | 4/2015 |

* cited by examiner

*Primary Examiner* — Michelle Mandala

(57) ABSTRACT

A dual-sided OLED display includes a package shell includes n transparent square box and a package cavity formed inside the package shell. An open terminal, arranged on both opposite sides of the package shell The first light-emitting display portion and the second light-emitting display portion arranged in the package cavity firmly. The dual-sided OLED display package structure includes a shell with fewer sealed opens which is produced in advance. Such a design effectively reduces the area of the package adhesive for the OLED display to further lessen the water vapor. It takes shorter time to package the OLED display so the yield increases owing to simple package.

17 Claims, 6 Drawing Sheets

# DUAL-SIDED OLED DISPLAY AND PACKAGE METHOD THEREOF

RELATED APPLICATIONS

This application is a National Phase of PCT Patent Application No. PCT/CN2016/101912 having International filing date of Oct. 12, 2016, which claims the benefit of priority of Chinese Patent Application No. 201610777214.9 filed on Aug. 30, 2016. The contents of the above applications are all incorporated by reference as if fully set forth herein in their entirety.

FIELD AND BACKGROUND OF THE INVENTION

The present disclosure relates to the field of a display technique, and more particularly, to a dual-sided organic light-emitting diode (OLED) display and a package method of the dual-sided OLED display.

Organic light-emitting diode (OLED) displays are more and more widely applied to various products, especially in cellphones, media players, and compact and introductory television sets. An OLED display is a self-luminous device with features of vivid colors, high-efficiency lamination, light weight, wide view angles, fast response, and high flexibility. But the light lifespan of the OLED display and the light-emitting material reduces suddenly once being damaged by water vapor and oxygen. So the OLED display is usually sealed when being packaged. The package structure of the OLED display demands high for the capability of protection of water vapor and oxygen.

The tendency to the diversity of the electronic products, a dual-sided device becomes hot on the market. But two sides of an OLED display need to be packaged when the device is packaged with a thin film. Since this method is more complicated, the production costs are higher. The cover of the OLED display on the package adhesive layer needs an adequate distance (i.e. touch width) between the cover and the substrate to assure a firm bonding when the cover is package. But this method disfavors the OLED display with a narrow bezel and with a higher screen-to-body ratio. Besides, the dual-sided device is often applied to an ever-changing or more adverse environment, such as outdoor display board and a billboard, so it is important to have a perfect package method to seclude the OLED display from water vapor and oxygen to make sure a long-time lifespan of the OLED display.

Therefore, the package method for the conventional dual-sided OLED display has shortcomings; that is, it is not easy to package the device, and the bezel of the display cannot be successfully narrowed. So it is urgent to improve the conventional technique.

SUMMARY OF THE INVENTION

An object of the present disclosure is to propose a dual-sided organic light-emitting diode (OLED) display. Specifically, a pre-made packaging shell with fewer open terminals is used to package the dual-sided OLED display. With respect to the related art, it takes long time to package a conventional OLED so it is disadvantageous to produce an OLED with a narrow bezel. With the present disclosure, the problem occurring in the related art is solved.

According to one embodiment of the present disclosure, a dual-sided organic light-emitting diode (OLED) display comprises: a first light-emitting display portion; a second light-emitting display portion, arranged opposite on a lower side of the first light-emitting display portion; a package shell, comprising an transparent square box; a package cavity, formed inside the package shell; the first light-emitting display portion and the second light-emitting display portion arranged in the package cavity firmly; and an open terminal, arranged on both opposite sides of the package shell, and configured to be an input of the first light-emitting display portion and the second light-emitting display portion when the first light-emitting display portion and the second light-emitting display portion are packaged. One or more than one side of the first light-emitting display portion and one or more than one side of the second light-emitting display portion adhere to an inner wall of the package cavity.

According to one embodiment of the present disclosure, the first light-emitting display portion and the second light-emitting display portion both belong to a top-light-emitting type; the first light-emitting display portion comprises a first light-emitting layer; an upper surface of the first light-emitting layer is attached to an upper inner surface of the package cavity; the second light-emitting display portion comprises a second light-emitting layer; a lower surface of the second light-emitting layer adheres to a lower inner surface of the package cavity; the first light-emitting layer and the second light-emitting layer share the first substrate.

According to one embodiment of the present disclosure, the packaging shell comprises an upper package plate, a lower package plate, and a side wall; the thickness of the side wall is thinner than the thickness of the upper package plate and the thickness of the lower package plate.

According to one embodiment of the present disclosure, an insulating layer is arranged in the package cavity; the insulating layer is formed on a surface of the first light-emitting layer and a surface of the second light-emitting layer.

According to one embodiment of the present disclosure, the insulating layer may be an arbitrary layer or a plurality of arbitrary layers made from inorganic materials such as Si3N4, silicon dioxide, and aluminum oxide.

According to one embodiment of the present disclosure, the first light-emitting display portion and the second light-emitting display portion both belong to a top-light-emitting type; the first light-emitting display portion comprises a first light-emitting layer and a first substrate; an upper surface of the first light-emitting layer is attached to an upper inner surface of the package cavity; the second light-emitting display portion comprises a second light-emitting layer and a second substrate; a lower surface of the second light-emitting layer adheres to a lower inner surface of the package cavity; the first substrate adheres to the second substrate.

According to one embodiment of the present disclosure, the first light-emitting display portion and the second light-emitting display portion both belong to a bottom-light-emitting type; the first light-emitting display portion comprises a first light-emitting layer and a first substrate; the second light-emitting display portion comprises a second light-emitting layer and a second substrate wherein an upper surface of the first substrate adheres to an upper inner surface of the package cavity; the first light-emitting layer adheres to a lower surface of the first substrate; a lower surface of the second substrate adheres to a lower inner surface of the package cavity; the second light-emitting layer adheres to an upper surface of the second substrate.

According to one embodiment of the present disclosure, the first light-emitting display portion belongs to the toplight-emitting type; the second light-emitting display portion belongs to the bottom-light-emitting type; the first light-emitting display portion comprises a first light-emitting layer and a first substrate; the second light-emitting display portion comprises a second light-emitting layer and a second substrate wherein an upper surface of the first light-emitting layer is attached to an upper inner surface of the package cavity; an upper surface of the first substrate is attached to a lower inner surface of the first light-emitting layer; a lower surface of the second substrate is attached to a lower inner surface of the package cavity; a lower surface of the second light-emitting layer is attached to an upper surface of the second substrate.

According to one embodiment of the present disclosure, one of the open terminals is arranged on a pad of the substrate.

According to one embodiment of the present disclosure, the open terminals arranged at the opposite side of the package shell are packaged with a package adhesive.

According to one embodiment of the present disclosure, a dual-sided organic light-emitting diode (OLED) display comprises: a first light-emitting display portion; a second light-emitting display portion, arranged opposite on a lower side of the first light-emitting display portion; a package shell, comprising an transparent square box; a package cavity, formed inside the package shell; the first light-emitting display portion and the second light-emitting display portion arranged in the package cavity firmly; and an open terminal, arranged on both opposite sides of the package shell, and configured to be an input of the first light-emitting display portion and the second light-emitting display portion when the first light-emitting display portion and the second light-emitting display portion are packaged.

According to one embodiment of the present disclosure, one or more than one side of the first light-emitting display portion and one or more than one side of the second light-emitting display portion adhere to an inner wall of the package cavity.

According to one embodiment of the present disclosure, the first light-emitting display portion and the second light-emitting display portion both belong to a top-light-emitting type; the first light-emitting display portion comprises a first light-emitting layer; an upper surface of the first light-emitting layer is attached to an upper inner surface of the package cavity; the second light-emitting display portion comprises a second light-emitting layer; a lower surface of the second light-emitting layer adheres to a lower inner surface of the package cavity; the first light-emitting layer and the second light-emitting layer share the first substrate.

According to one embodiment of the present disclosure, the packaging shell comprises an upper package plate, a lower package plate, and a side wall; the thickness of the side wall is thinner than the thickness of the upper package plate and the thickness of the lower package plate.

According to one embodiment of the present disclosure, an insulating layer is arranged in the package cavity; the insulating layer is formed on a surface of the first light-emitting layer and a surface of the second light-emitting layer.

According to one embodiment of the present disclosure, the first light-emitting display portion and the second light-emitting display portion both belong to a top-light-emitting type; the first light-emitting display portion comprises a first light-emitting layer and a first substrate; an upper surface of the first light-emitting layer is attached to an upper inner surface of the package cavity; the second light-emitting display portion comprises a second light-emitting layer and a second substrate; a lower surface of the second light-emitting layer adheres to a lower inner surface of the package cavity; the first substrate adheres to the second substrate.

According to one embodiment of the present disclosure, the first light-emitting display portion and the second light-emitting display portion both belong to a bottom-light-emitting type; the first light-emitting display portion comprises a first light-emitting layer and a first substrate; the second light-emitting display portion comprises a second light-emitting layer and a second substrate wherein an upper surface of the first substrate adheres to an upper inner surface of the package cavity; the first light-emitting layer adheres to a lower surface of the first substrate; a lower surface of the second substrate adheres to a lower inner surface of the package cavity; the second light-emitting layer adheres to an upper surface of the second substrate.

According to one embodiment of the present disclosure, the first light-emitting display portion belongs to the top-light-emitting type; the second light-emitting display portion belongs to the bottom-light-emitting type; the first light-emitting display portion comprises a first light-emitting layer and a first substrate; the second light-emitting display portion comprises a second light-emitting layer and a second substrate wherein an upper surface of the first light-emitting layer is attached to an upper inner surface of the package cavity; an upper surface of the first substrate is attached to a lower inner surface of the first light-emitting layer; a lower surface of the second substrate is attached to a lower inner surface of the package cavity; a lower surface of the second light-emitting layer is attached to an upper surface of the second substrate.

According to one embodiment of the present disclosure, one of the open terminals is arranged on a pad of the substrate.

According to one embodiment of the present disclosure, a package method of a dual-sided OLED display includes: supplying a sealed package shell, one or more sides of the package shell being equipped with an open terminal, a hollow inside of the package shell forming a package cavity; coating an adhesive onto one surface of a light emitting display portion and putting the light emitting display portion into the package cavity from the open terminal; adhering the light emitting display portion to an inner wall of the package cavity; solidifying the inside of the package cavity with the adhesive, and extracting water vapor and oxygen inside the package cavity off; and packaging the open terminal with a package adhesive.

The present disclosure provides the benefits as follows: The dual-sided OLED display package structure includes a shell with fewer sealed opens which is produced in advance. Such a design effectively reduces the area of the package adhesive for the OLED display to further lessen the water vapor. It takes shorter time to package the OLED display so the yield increases owing to simple package. The open terminal can be arranged on one side of the pad of the substrate, which helps enhance the screen-to-body ratio of the display screen in an electronic product.

BRIEF DESCRIPTION OF THE SEVERAL VIEWS OF THE DRAWINGS

The accompanying drawings are included to provide a further understanding of the invention, and are incorporated in and constitute a part of this specification. The drawings

DESCRIPTION OF SPECIFIC EMBODIMENTS OF THE INVENTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

An object of the present disclosure is to propose a new-type OLED display to replace a conventional OLED display. The drawbacks of the conventional OLED display are that the package is not easy and swift, the water vapor/oxygen effect is poorer, and that the bezel of the display is narrower.

The OLED display includes a substrate, a light-emitting layer, and a package shell. The light-emitting layer includes an OLED display array. The OLED display includes an electrical thin-film transistor (TFT) switch layer for control, an anode electrode, a cathode electrode, and a light-emitting layer. The light-emitting layer is formed by the anode electrode and the cathode electrode where a light-emitting is inserted. In addition to the light-emitting layer, a hole injection layer, a hole transport layer, an electron transport layer, and an electron injection layer can be inserted between the anode electrode and the cathode electrode. When a drive voltage is imposed on the anode electrode and the cathode electrode, electrons in the electron transport layer move to the light-emitting material from the hole of the hole transport layer and the electron transport layer to form excitons and the light-emitting material layer emits a visible light. In the OLED display, pixels with the OLED are arranged in a matrix, and a display image is shown by optionally controlling a data voltage and a scanning voltage.

Embodiment 1

Figure 1:
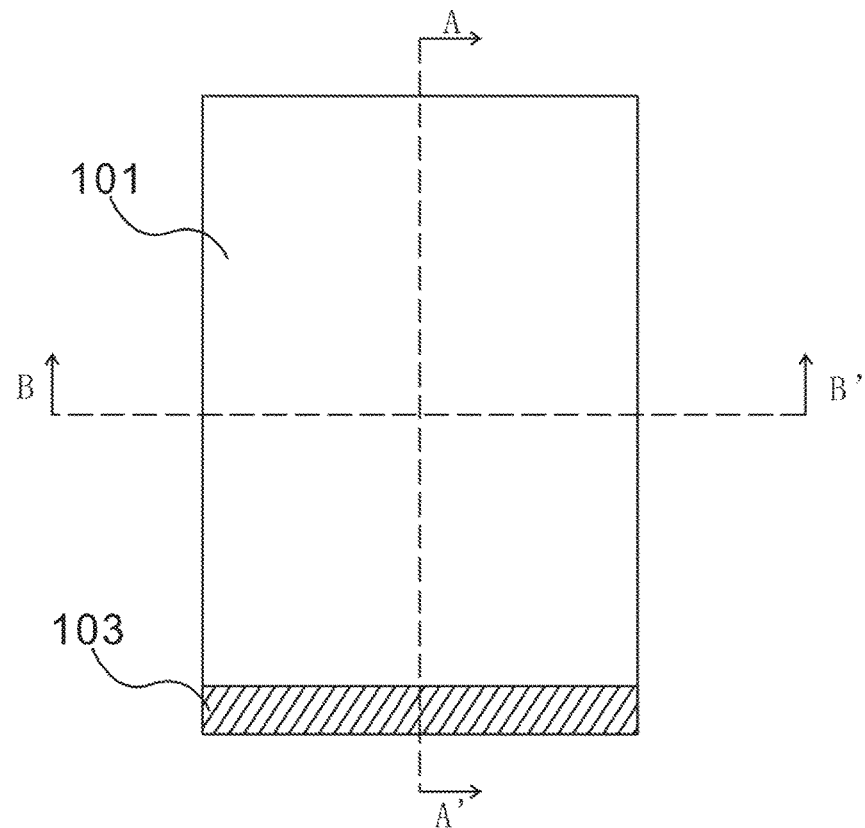
FIG. 1 is a top view of a dual-sided organic light-emitting diode (OLED) display according to a first embodiment of the present disclosure.

FIG. 1 is a top view of a dual-sided organic light-emitting diode (OLED) display according to a first embodiment of the present disclosure. The OLED display includes a package shell 101 and a first substrate 103 of a light-emitting display portion in the package shell 101. The package shell 101 is all-in-one or integrated after a transparent material is injected to a mould, and the size of the mould matches the light-emitting display portion. For example, the transparent material may be liquid glass or plastics.

Figure 2:
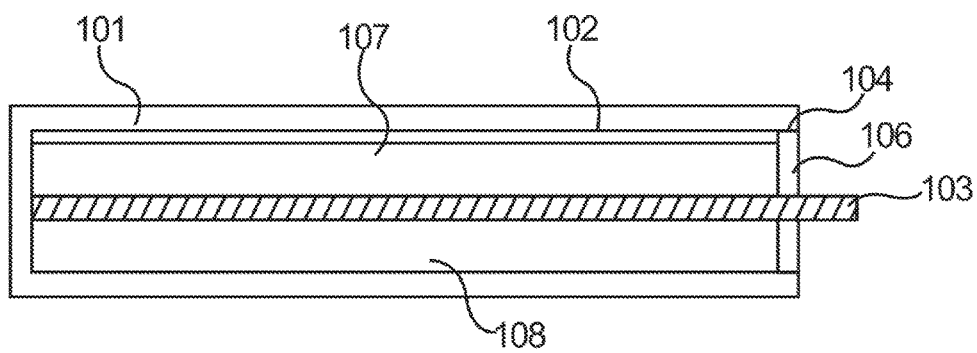
FIG. 2 is a sectional diagram showing the dual-sided OLED display shown in FIG. 1 along an A-A' line.

FIG. 2 is a sectional diagram showing the dual-sided OLED display shown in FIG. 1 along an A-A' line. The hollow inside of the package shell forms a package cavity 102 where a light-emitting display portion is arranged. The upper, lower, left, front, and back sides of the enclosed package cavity 102 are all planes. The package shell 101 is shaped as a flat cuboid. Also, an open terminal 104 is arranged on one side of the package shell 101 and the light-emitting display portion extends to the package cavity 102. Preferably, the open terminal 104 is arranged on one side of a pad of the first substrate 103. Next, one side or two sides of the front and back sides of the light-emitting display portion adhere(s) to a side wall of the package cavity 102. Finally, the open terminal 104 put is sealed with a package adhesive 106 so that the light-emitting display portion in the package cavity 102 can be secluded from the external water vapor and oxygen. The pad of the first substrate 103 is also known as "bonding zone," that is, the driver integrated circuit (IC) and the printed circuit board (PCB). In this way, the bezel of the display is successfully narrowed. Take a top-light-emitting OLED display with the package structure proposed by the present disclosure for example. A light-emitting layer in the top-light-emitting OLED display emits light to the human eye directly through the package layer. The emitted light is away from one side of the substrate.

For example, the dual-sided OLED display includes a first light-emitting display portion and a second light-emitting display portion. The first light-emitting display portion includes a first light-emitting layer 107. The upper surface of the first light-emitting layer 107 is attached to the upper inner surface of the package cavity 102. The second light-emitting display portion includes a second light-emitting layer 108. The lower surface of the second light-emitting layer 108 is attached to the lower inner surface of the package cavity 102 with an adhesive layer. The first light-emitting layer 107 and the second light-emitting layer 108 share the first substrate 103, which forms the dual-sided display portion.

When the device is installed, the terminals or the surface of the dual-sided display portion are coated with the adhesive at first. Then, the open terminal 104 of the dual-sided display portion extends to the package cavity 102, and the dual-sided display portion adheres to the inner wall of the package cavity 102. Next, the adhesive material in the inside of the package cavity 102 is solidified and dried, and water vapor and oxygen inside the package cavity 102 are driven off. Finally, the open terminal 104 is package with an adhesive material. Preferably, the adhesive material may be a heat-curing, ultraviolet (UV)-curing, or glass powder material. The adhesive material for the dual-sided display portion and the adhesive material for the inner wall of the package cavity 102 may be the same as the adhesive material for the open terminal 104. Or, the adhesive material for the dual-sided display portion and the adhesive material for the inner wall of the package cavity 102 may be an adhesive material different from the adhesive material for the inner wall of the package cavity 102.

Further, the dual-sided display portion can be packaged with a method with following steps: Step 1: Arrange the package shell 101 straight and put the side where the open terminal 104 is arranged upward. Step 2: Put the package shell 101 with the open terminal 104 in the package cavity 102 and set the dual-sided display portion on the middle of the package cavity 102. The front and back surfaces of the dual-sided display portion do not touch the inner wall of the package cavity 102. Step 3: Fill a drier in a slit of the package cavity 102, and continue keeping the package shell 101 straight or toppled over. Step 4: Supply the open terminal 104 with a package adhesive 106.

The dual-sided display portion adheres to the package shell 101. The package shell 101 may be made from glass or plastics and an entity with other organic matters or inorganic matters. The thickness of the package shell 101 is thinner, ranging from 0.05 mm to 10 mm. The package shell 101 which the force is imposed is flexible to a certain extent, and it becomes easier to attach the two display portions to the package shell 101.

Preferably, the number of the open terminal 104 of the package shell 101 may be one, two, or three. For example, the two open terminals 104 may be adjacent to each other or may be opposite instead of being adjacent to each other. If two or three open terminals 104 are used, the two display portions may be fixed to the upper and lower inner surfaces of the package shell without any adhesives. It is also possible that the two display portions are fixed with two terminals of the substrate 103 extending to the package adhesive 106.

For example, an open terminal 104 is arranged on each of the two opposite terminals of the package shell 101. The package shell 10 for the dual-sided display portion is arranged horizontally or vertically. When the package shell 102 is horizontally arranged, the sides where the open terminals 104 are arranged face the right and left sides. Then, the dual-sided display portion with the open terminal 104 on the right or left side is put in the package cavity 102. The, the dual-sided display portion adheres to the inner wall of the package cavity 102. Finally, the two open terminals 104 are sealed with an adhesive material.

Or, an open is arranged at each of the two sides of the package shell 101. The two opens are the open terminals 104 with an L-type. The open of the open terminal 104 is larger when the device is packaged so that the dual-sided display portion can put in the package cavity 102 easily. The package method is similar to the method that the open terminal 104 is arranged on each of the two opposite sides of the package shell 101. The related details are skipped here.

Figure 3:
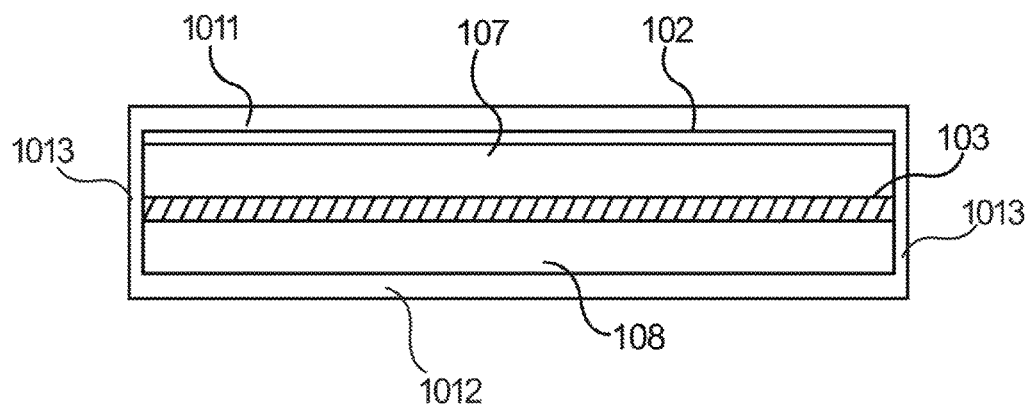
FIG. 3 is a sectional diagram showing the dual-sided OLED display shown in FIG. 1 along a B-B' line.

FIG. 3 is a sectional diagram showing the dual-sided OLED display shown in FIG. 1 along a B-B' line. The packaging shell 101 includes an upper package plate 1011, a lower package plate 1012, and a side wall 1013. The side wall 1013, the upper package plate 1011, the lower package plate 1012 are all-in-one or integrated. Such integration is beneficial to seclude the dual-sided display portion inside the packaging shell 101 from the external vapor/oxygen and to adhere to the dual-sided display portion inside the packaging shell 101 firmly when being packaged.

Further, the thickness of the side wall 1013 may not be consistent with the thickness of the upper package plate 1011 and the thickness of the lower package plate 1012. For example, the thickness of the side wall 1013 is thinner than the thickness of the upper package plate 1011 and the thickness of the lower package plate 1012. It implies the thickness of the bezel of the display is smaller.

Embodiment 2

Figure 4:
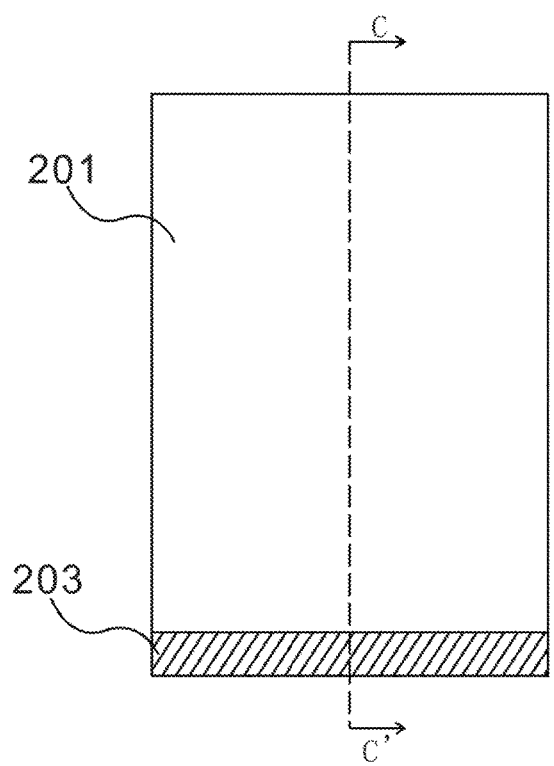
FIG. 4 is a top view of a dual-sided organic light-emitting diode (OLED) display according to a second embodiment of the present disclosure.

FIG. 4 is a top view of a dual-sided organic light-emitting diode (OLED) display according to a second embodiment of the present disclosure. The OLED display includes a package shell 201 and a first substrate 203 of a light-emitting display portion in the package shell 201.

Figure 5:
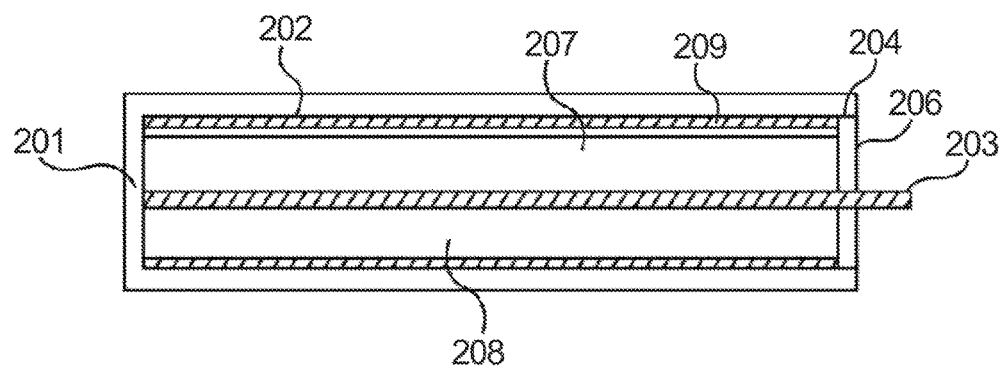
FIG. 5 is a sectional diagram showing the dual-sided OLED display shown in FIG. 4 along a C-C' line.

FIG. 5 is a sectional diagram showing the dual-sided OLED display shown in FIG. 4 along a C-C' line. A package cavity 202 is formed in the package shell 201. An open terminal 204 is arranged on one side of the package shell 201. The open terminal 204 put in the package cavity 202 of the light-emitting display portion is sealed with a package adhesive 206. A first light-emitting display portion and a second light-emitting display portion are included. The first light-emitting display portion includes a first light-emitting layer 207, a second light-emitting 208, a first substrate 203 arranged between the first light-emitting layer 207 and the second light-emitting 208. The first light-emitting layer 207, the second light-emitting 208, and the first substrate 203 form a dual-sided display portion.

Preferably, the number of the open terminal 204 of the package shell 201 may be one, two, or three. For example, the two open terminals 204 may be adjacent to each other or may be opposite instead of being adjacent to each other. If two or three open terminals 204 are used, the two display portions may be fixed to the upper and lower inner surfaces of the package shell without any adhesives. It is also possible that the two display portions are fixed with two terminals of the first substrate 203 extending to the package adhesive 206.

The distinction between this embodiment and the first embodiment is as follows. Before the dual-sided display portion extends to the package cavity 202, an insulating layer 209 is arranged on the surface of the first light-emitting layer 207 and the surface of the second light-emitting layer 208 to prevent the OLED display from being touched by water vapor and oxygen. In this way, the short circuit is prevented. The insulating layer 209 may be a layer or a plurality of layers made of inorganic materials such as $Si_3N_4$, silicon dioxide, and aluminum oxide. Further, the insulating layer 209 includes an organic layer.

Embodiment 3

Figure 6:
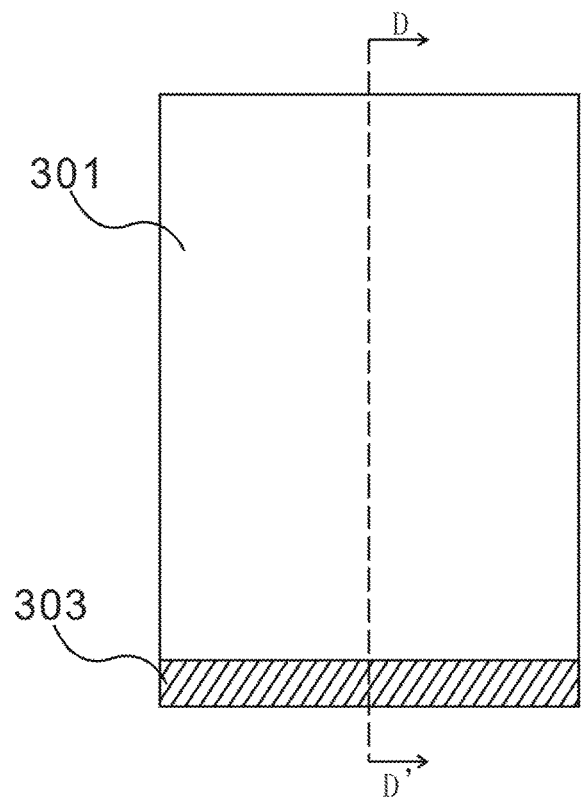
FIG. 6 is a top view of a dual-sided organic light-emitting diode (OLED) display according to a third embodiment of the present disclosure.

FIG. 6 is a top view of a dual-sided organic light-emitting diode (OLED) display according to a third embodiment of the present disclosure. The OLED display includes a package shell 301 and a first substrate 303 of a light-emitting display portion in the package shell 301.

Figure 7:
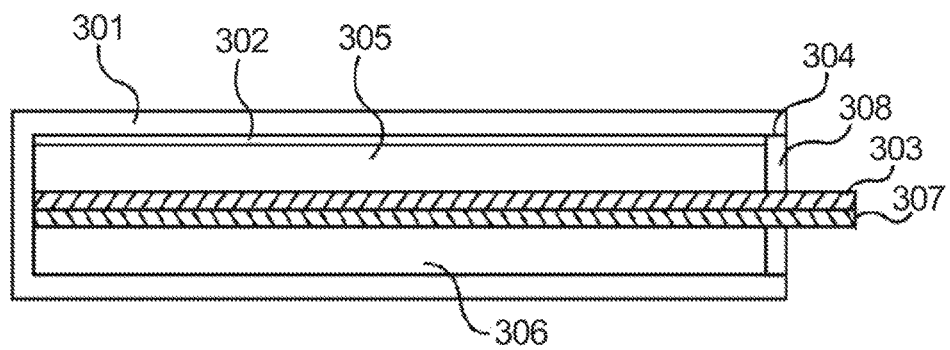
FIG. 7 is a sectional diagram showing the dual-sided OLED display shown in FIG. 6 along a D-D' line.

FIG. 7 is a sectional diagram showing the dual-sided OLED display shown in FIG. 6 along a D-D' line. A package cavity 302 is formed in the package shell 301. An open terminal 304 is arranged on one side of the package shell 301. The open terminal 304 put in the package cavity 302 of the light-emitting display portion is sealed with a package adhesive 308. The first light-emitting display portion includes a first light-emitting layer 305 and a first substrate 303. The upper surface of the first light-emitting layer 305 is attached to the upper inner surface of the package cavity 302. The second light-emitting display portion includes a second light-emitting layer 306 and a second substrate 307.

The lower surface of the second light-emitting layer 306 is attached to the lower inner surface of the package cavity 302. The first substrate 303 is attached to the second substrate 307. The package method proposed by this embodiment is very similar to the package method proposed by the first embodiment. The package method proposed by this embodiment will not be detailed.

Preferably, the first substrate 303 and the second substrate 307 can be fixed firmly with an adhesive or a bonding layer. The adhesive or the bonding layer may be a transparent or opaque bonding material such as an optical clear adhesive (OCA) and an optical character recognition (OCR).

Preferably, the number of the open terminal 304 of the package shell 301 may be one, two, or three. For example, the two open terminals 304 may be adjacent to each other or may be opposite instead of being adjacent to each other. If two or three open terminals 304 are used, the two display portions may be fixed to the upper and lower inner surfaces of the package shell without any adhesives. It is also possible that the two display portions are fixed with two terminals of the first substrate 303 and two terminals of the second substrate 307 extending to the package adhesive 308.

The distinction between this embodiment and the previous two embodiments is as follows. In this embodiment the surface of the first light-emitting layer 305 and the surface of the second light-emitting layer 306 are arranged on different substrates while the two light-emitting layers share the same substrate in the previous two embodiments. In other words, the dual-sided display portion of the dual-sided OLED display is formed by the two display portions adhering/attached to the substrate.

Embodiment 4

The package structure proposed by the present disclosure is introduced using a bottom-light-emitting organic light-emitting diode (OLED) display. The bottom-light-emitting OLED display includes a light-emitting layer arranged at the bottom of the substrate. The light emitted by the light-emitting layer passes through the substrate and the package layer and reaches the human eye directly.

Figure 8:
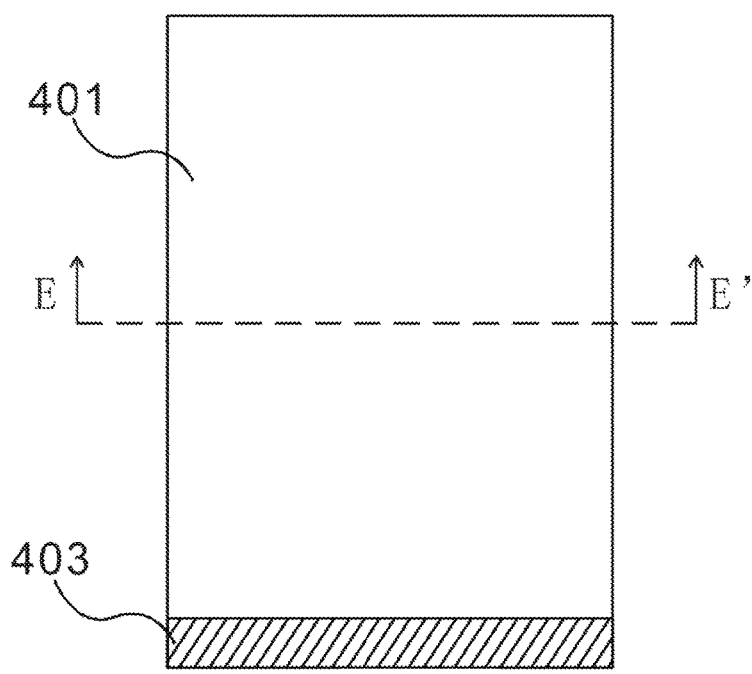
FIG. 8 is a top view of a dual-sided OLED display according to a fourth embodiment of the present disclosure.

FIG. 8 is a top view of a dual-sided OLED display according to a fourth embodiment of the present disclosure. The OLED display includes a package shell 401 and a first substrate 403 of a light-emitting display portion in the package shell 401.

Figure 9:
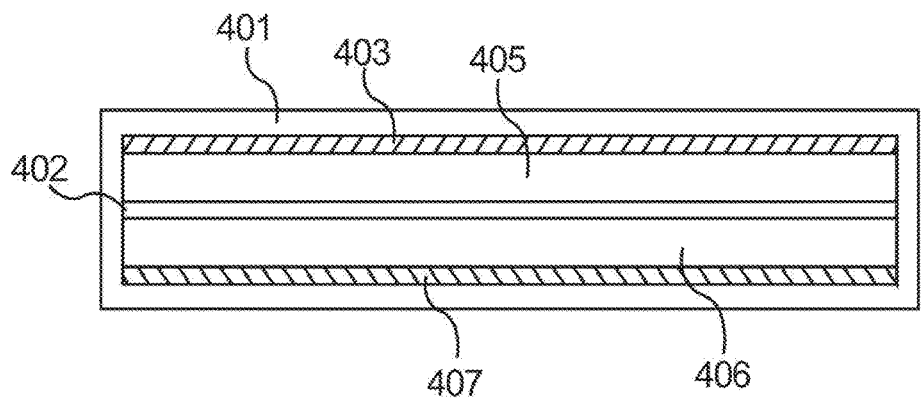
FIG. 9 is a sectional diagram showing the dual-sided OLED display shown in FIG. 8 along an E-E' line.

FIG. 9 is a sectional diagram showing the dual-sided OLED display shown in FIG. 8 along an E-E' line. A package cavity 402 is formed in the package shell 401. An open terminal is arranged on one side of the package shell 401. The open terminal put in the package cavity 402 of the light-emitting display portion is sealed with a package adhesive. The first light-emitting display portion includes a first light-emitting layer 405 and a first substrate 403. The second light-emitting display portion includes a second light-emitting layer 406 and a second substrate 407. The upper surface of the second substrate 407 adheres to the upper inner surface of the package cavity 402. The first light-emitting layer 405 adheres to the upper inner surface of the first substrate 403. The lower surface of the second substrate 407 adheres to the lower inner surface of the package cavity 402. The second light-emitting layer 406 adheres to the upper inner surface of the second substrate 407.

Preferably, the number of the open terminal of the package shell 401 may be one, two, or three. For example, the two open terminals may be adjacent to each other or may be opposite instead of being adjacent to each other. If two or three open terminals are used, the two display portions may be fixed to the upper and lower inner surfaces of the package shell without any adhesives. It is also possible that the two display portions are fixed with two terminals of the first substrate 403 and two terminals of the second substrate 407 extending to the package adhesive.

The dual-sided display portion includes the package structure proposed by the present disclosure. The package method includes steps as follows: Step 1: Arrange the package shell 401 straight and put the side where the open terminal is arranged upward. Step 2: Put the first light-emitting display portion with the open terminal in the package cavity 402 and adhere one side of the first substrate 403 which is away from the first light-emitting layer 405 to the inner wall of the package cavity 402. Step 3: Put the second light-emitting display portion with the open terminal in the package cavity 402 and adhere one side of the second substrate 407 which is away from the second light-emitting layer 406 to the inner wall of the package cavity 402. Step 4: Supply the package cavity 402 with a package adhesive, and continue keeping the package shell 401 straight or toppled over. Step 5: Supply the open terminal with a package adhesive, and arrange a package layer between the two substrates at the open terminal of the package shell 401.

Further, the sides of the two display portions adhere to each other with the bonding layer, and then the same method/steps proposed by the first embodiment are adopted to finish package in this embodiment.

The distinction between this embodiment and the previous embodiments is as follows. In this embodiment, the first light-emitting display portion and the second light-emitting display portion both belong to the bottom-light-emitting type, and the first light-emitting display portion and the second light-emitting display portion are independent. The first substrate 403 and the second substrate 407 adhere to the upper and lower inner surfaces of the package cavity 402, respectively.

Embodiment 5

Figure 10:
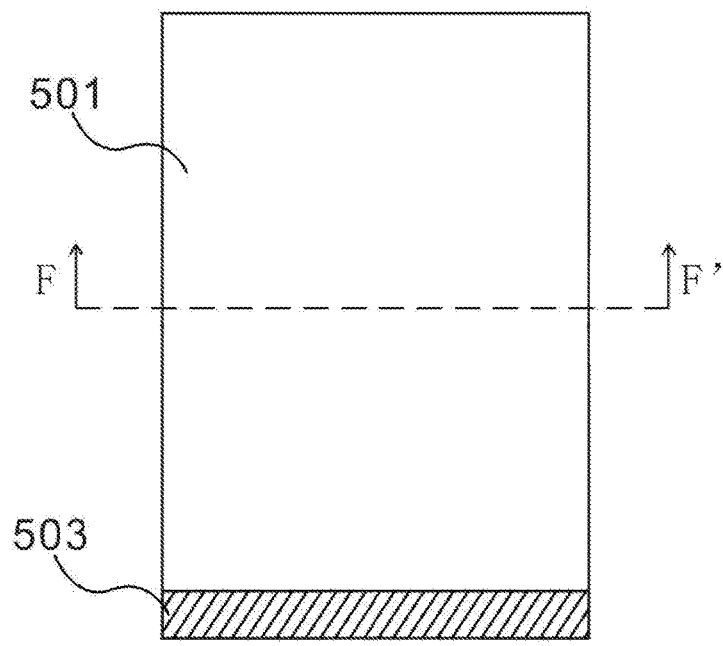
FIG. 10 is a top view of a dual-sided organic light-emitting diode (OLED) display according to a fifth embodiment of the present disclosure.

FIG. 10 is a top view of a dual-sided organic light-emitting diode (OLED) display according to a fifth embodiment of the present disclosure. The OLED display includes a package shell 501 and a first substrate 503 of a light-emitting display portion in the package shell 501.

Figure 11:
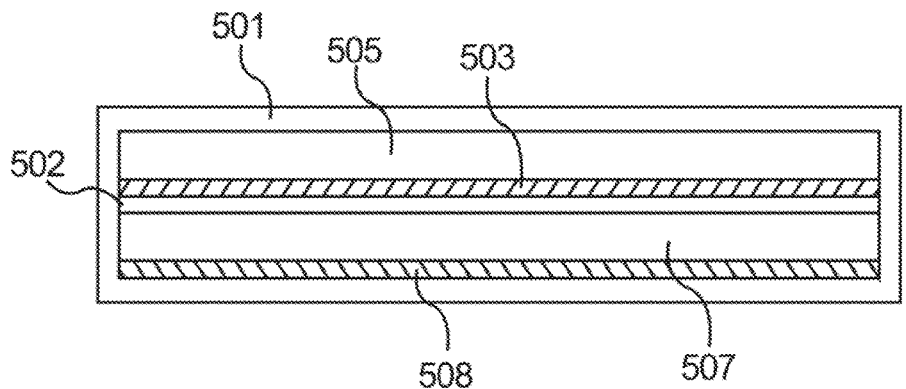
FIG. 11 is a sectional diagram showing the dual-sided OLED display shown in FIG. 10 along an F-F' line.

FIG. 11 is a sectional diagram showing the dual-sided OLED display shown in FIG. 10 along an F-F' line. A package cavity 502 is formed in the package shell 501. An open terminal is arranged on one side of the package shell 501. The open terminal put in the package cavity 502 of the light-emitting display portion is sealed with a package adhesive. The first light-emitting display portion includes a first light-emitting layer 505 and a first substrate 503. The second light-emitting display portion includes a second light-emitting layer 507 and a second substrate 508. The upper surface of the first light-emitting layer 505 is attached to the upper inner surface of the package cavity 502. The upper surface of the first substrate 503 is attached to the lower surface of the first light-emitting layer 505. The lower surface of the second substrate 508 is attached to the lower inner surface of the package cavity 502. The lower surface of the second light-emitting layer 507 is attached to the upper surface of the second substrate 508. The package method proposed by this embodiment is very similar to the package methods proposed by the previous embodiments. The package method proposed by this embodiment will not be detailed.

Preferably, the number of the open terminal of the package shell 501 may be one, two, or three. For example, the two open terminals may be adjacent to each other or may be opposite instead of being adjacent to each other. If two or three open terminals are used, the two display portions may be fixed to the upper and lower inner surfaces of the package shell without any adhesives. It is also possible that the two display portions are fixed with two terminals of the first substrate 503 and two terminals of the second substrate 508 extending to the package adhesive.

The distinction between this embodiment and the previous embodiments is as follows. In this embodiment, the first light-emitting display portion belongs to the top-light-emitting type, the second light-emitting display portion belongs to the bottom-light-emitting type, and the first light-emitting display portion and the second light-emitting display portion are independent. The first substrate 503 and the second substrate 508 adhere to the upper and lower inner surfaces of the package cavity 502, respectively, when the first substrate 503 and the second substrate 508 are packaged.

Figure 12:
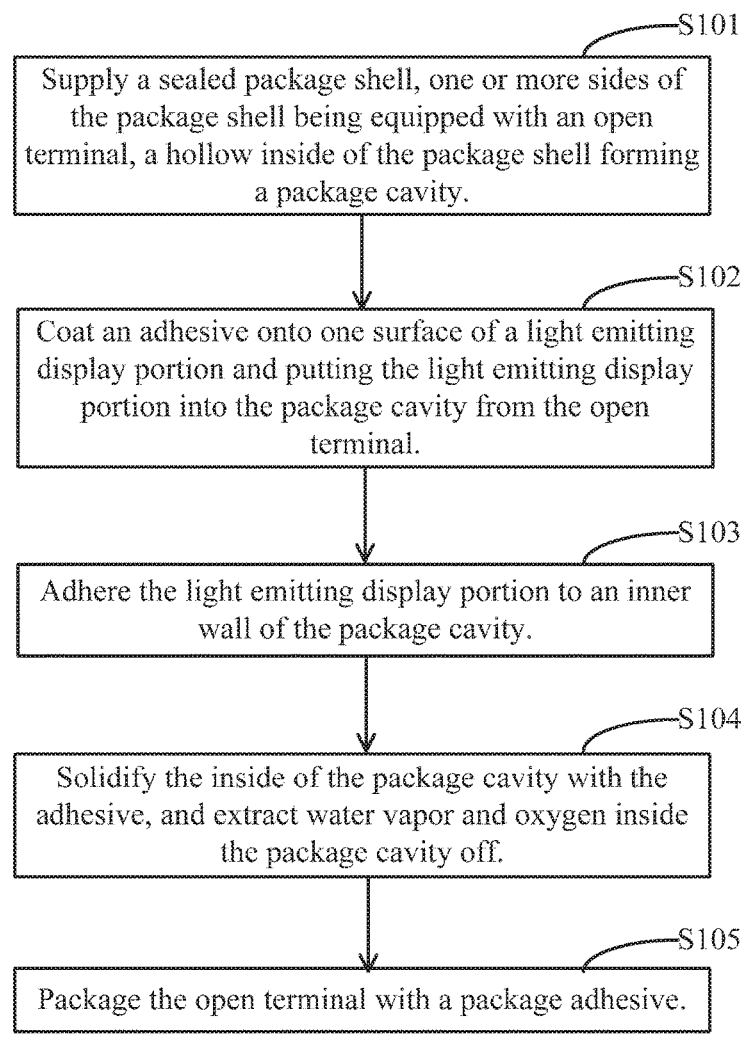
FIG. 12 illustrates a flowchart of a package method of a dual-sided OLED display according to the present disclosure.

Please refer to FIG. 12. A package method of a dual-sided OLED display is proposed by the present disclosure. The method includes steps:

S101: Supply a sealed package shell. One or more sides of the package shell are equipped with an open terminal. The hollow inside of the package shell forms a package cavity.

S102: Coat an adhesive onto one surface of a light emitting display portion and put the light emitting display portion into the package cavity from the open terminal.

S103: Adhere the light emitting display portion to an inner wall of the package cavity opposite.

S104: Solidify the inside of the package cavity with the adhesive, and extract water vapor and oxygen inside the package cavity off.

S105: Package the open terminal with a package adhesive. At this stage, the light emitting display portion completes packaged with the package shell.

The dual-sided OLED display package structure includes a shell with fewer sealed opens which is produced in advance. Such a design effectively reduces the area of the package adhesive for the OLED display to further lessen the water vapor. It takes shorter time to package the OLED display so the yield increases owing to simple package. The open terminal can be arranged on one side of the pad of the substrate, which helps enhance the screen-to-body ratio of the display screen in an electronic product.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A dual-sided organic light-emitting diode (OLED) display, comprising:
   a first light-emitting display portion;
   a second light-emitting display portion, arranged opposite on a lower side of the first light-emitting display portion;
   a package shell, comprising an transparent square box; and
   a package cavity, formed inside the package shell; the first light-emitting display portion and the second light-emitting display portion arranged in the package cavity firmly;
   an open terminal, arranged on both opposite sides of the package shell, and configured to be an input of the first light-emitting display portion and the second light-emitting display portion when the first light-emitting display portion and the second light-emitting display portion are packaged;
   wherein one or more than one side of the first light-emitting display portion and one or more than one side of the second light-emitting display portion adhere to an inner wall of the package cavity,
   wherein the first light-emitting display portion and the second light-emitting display portion both belong to a top-light-emitting type; the first light-emitting display portion comprises a first light-emitting layer; an upper surface of the first light-emitting layer is attached to an upper inner surface of the package cavity; the second light-emitting display portion comprises a second light-emitting layer; a lower surface of the second light-emitting layer adheres to a lower inner surface of the package cavity; the first light-emitting layer and the second light-emitting layer share the first substrate.

2. The dual-sided OLED display of claim 1, wherein the packaging shell comprises an upper package plate, a lower package plate, and a side wall; the thickness of the side wall is thinner than the thickness of the upper package plate and the thickness of the lower package plate.

3. The dual-sided OLED display of claim 1, wherein an insulating layer is arranged in the package cavity; the insulating layer is formed on a surface of the first light-emitting layer and a surface of the second light-emitting layer.

4. The dual-sided OLED display of claim 3, wherein the insulating layer may be an arbitrary layer or a plurality of arbitrary layers made from inorganic materials such as Si3N4, silicon dioxide, and aluminum oxide.

5. The dual-sided OLED display of claim 1, wherein the first light-emitting display portion and the second light-emitting display portion both belong to a top-light-emitting type; the first light-emitting display portion comprises a first light-emitting layer and a first substrate; an upper surface of the first light-emitting layer is attached to an upper inner surface of the package cavity; the second light-emitting display portion comprises a second light-emitting layer and a second substrate; a lower surface of the second light-emitting layer adheres to a lower inner surface of the package cavity; the first substrate adheres to the second substrate.

6. The dual-sided OLED display of claim 1, wherein the first light-emitting display portion and the second light-emitting display portion both belong to a bottom-light-emitting type; the first light-emitting display portion comprises a first light-emitting layer and a first substrate; the second light-emitting display portion comprises a second light-emitting layer and a second substrate wherein an upper surface of the first substrate adheres to an upper inner surface of the package cavity; the first light-emitting layer adheres to a lower surface of the first substrate; a lower surface of the second substrate adheres to a lower inner surface of the package cavity; the second light-emitting layer adheres to an upper surface of the second substrate.

7. The dual-sided OLED display of claim 1, wherein the first light-emitting display portion belongs to the top-light-emitting type; the second light-emitting display portion belongs to the bottom-light-emitting type; the first light-emitting display portion comprises a first light-emitting layer and a first substrate; the second light-emitting display portion comprises a second light-emitting layer and a second substrate wherein an upper surface of the first light-emitting layer is attached to an upper inner surface of the package cavity; an upper surface of the first substrate is attached to a lower inner surface of the first light-emitting layer; a lower surface of the second substrate is attached to a lower inner surface of the package cavity; a lower surface of the second light-emitting layer is attached to an upper surface of the second substrate.

8. The dual-sided OLED display of claim 1, wherein one of the open terminals is arranged on a pad of the substrate.

9. The dual-sided OLED display of claim 1, wherein the open terminals arranged at the opposite side of the package shell are packaged with a package adhesive.

10. A dual-sided organic light-emitting diode (OLED) display, comprising:
    a first light-emitting display portion;
    a second light-emitting display portion, arranged opposite on a lower side of the first light-emitting display portion;
    a package shell, comprising an transparent square box; and
    a package cavity, formed inside the package shell; the first light-emitting display portion and the second light-emitting display portion arranged in the package cavity firmly;
    an open terminal, arranged on both opposite sides of the package shell, and configured to be an input of the first light-emitting display portion and the second light-emitting display portion when the first light-emitting display portion and the second light-emitting display portion are packaged,
    wherein one of the open terminals is arranged on a pad of the substrate.

11. The dual-sided OLED display of claim 10, wherein one or more than one side of the first light-emitting display portion and one or more than one side of the second light-emitting display portion adhere to an inner wall of the package cavity.

12. The dual-sided OLED display of claim 10, wherein the first light-emitting display portion and the second light-emitting display portion both belong to a top-light-emitting type; the first light-emitting display portion comprises a first light-emitting layer; an upper surface of the first light-emitting layer is attached to an upper inner surface of the package cavity; the second light-emitting display portion comprises a second light-emitting layer; a lower surface of the second light-emitting layer adheres to a lower inner surface of the package cavity; the first light-emitting layer and the second light-emitting layer share the first substrate.

13. The dual-sided OLED display of claim 10, wherein the packaging shell comprises an upper package plate, a lower package plate, and a side wall; the thickness of the side wall is thinner than the thickness of the upper package plate and the thickness of the lower package plate.

14. The dual-sided OLED display of claim 12, wherein an insulating layer is arranged in the package cavity; the insulating layer is formed on a surface of the first light-emitting layer and a surface of the second light-emitting layer.

15. The dual-sided OLED display of claim 11, wherein the first light-emitting display portion and the second light-emitting display portion both belong to a top-light-emitting type; the first light-emitting display portion comprises a first light-emitting layer and a first substrate; an upper surface of the first light-emitting layer is attached to an upper inner surface of the package cavity; the second light-emitting display portion comprises a second light-emitting layer and a second substrate; a lower surface of the second light-emitting layer adheres to a lower inner surface of the package cavity; the first substrate adheres to the second substrate.

16. The dual-sided OLED display of claim 11, wherein the first light-emitting display portion and the second light-emitting display portion both belong to a bottom-light-emitting type; the first light-emitting display portion comprises a first light-emitting layer and a first substrate; the second light-emitting display portion comprises a second light-emitting layer and a second substrate wherein an upper surface of the first substrate adheres to an upper inner surface of the package cavity; the first light-emitting layer adheres to a lower surface of the first substrate; a lower surface of the second substrate adheres to a lower inner surface of the package cavity; the second light-emitting layer adheres to an upper surface of the second substrate.

17. The dual-sided OLED display of claim 11, wherein the first light-emitting display portion belongs to the top-light-emitting type; the second light-emitting display portion belongs to the bottom-light-emitting type; the first light-emitting display portion comprises a first light-emitting layer and a first substrate; the second light-emitting display portion comprises a second light-emitting layer and a second substrate wherein an upper surface of the first light-emitting layer is attached to an upper inner surface of the package cavity; an upper surface of the first substrate is attached to a lower inner surface of the first light-emitting layer; a lower surface of the second substrate is attached to a lower inner surface of the package cavity; a lower surface of the second light-emitting layer is attached to an upper surface of the second substrate.

* * * * *